United States Patent
Fukui et al.

(10) Patent No.: US 7,567,022 B2
(45) Date of Patent: Jul. 28, 2009

(54) METHOD FOR FORMING PEROVSKITE TYPE OXIDE THIN FILM, PIEZOELECTRIC ELEMENT, LIQUID DISCHARGE HEAD, AND LIQUID DISCHARGE APPARATUS

(75) Inventors: Tetsuro Fukui, Yokohama (JP); Kenichi Takeda, Yokohama (JP); Takanori Matsuda, Chofu (JP); Hiroshi Funakubo, Yokohama (JP); Shintaro Yokoyama, Yokohama (JP)

(73) Assignees: Canon Kabushiki Kaisha, Tokyo (JP); Tokyo Institute of Technology, Tokyo (JP)

( * ) Notice: Subject to any disclaimer, the term of this patent is extended or adjusted under 35 U.S.C. 154(b) by 392 days.

(21) Appl. No.: 11/582,403

(22) Filed: Oct. 18, 2006

(65) Prior Publication Data
US 2007/0090730 A1    Apr. 26, 2007

(30) Foreign Application Priority Data
Oct. 20, 2005    (JP) .............................. 2005-305815

(51) Int. Cl.
H01L 41/00    (2006.01)
H01L 41/187    (2006.01)

(52) U.S. Cl. ................................. 310/358; 252/62.9 PZ
(58) Field of Classification Search .......... 310/357–359
See application file for complete search history.

(56) References Cited
U.S. PATENT DOCUMENTS

| | | | |
|---|---|---|---|
| 7,166,954 B2 * | 1/2007 | Miyazawa et al. | 310/358 |
| 7,196,457 B2 * | 3/2007 | Miyazawa et al. | 310/358 |
| 7,215,067 B2 * | 5/2007 | Ifuku et al. | 310/357 |
| 7,279,825 B2 * | 10/2007 | Ifuku et al. | 310/358 |
| 7,301,261 B2 * | 11/2007 | Ifuku et al. | 310/358 |
| 7,312,558 B2 * | 12/2007 | Fujii et al. | 310/358 |
| 7,453,188 B2 * | 11/2008 | Matsuda et al. | 310/358 |
| 7,482,736 B2 * | 1/2009 | Ueno et al. | 310/358 |
| 2006/0049723 A1 | 3/2006 | Okabe et al. | 310/348 |

OTHER PUBLICATIONS

Seung-Eek Park, et al., "Ultrahigh strain and piezoelectric behavior in relaxor based ferroelectric single crystals", Journal of Applied Physics, vol. 82, No. 4, Aug. 15, 1997, pp. 1804-1811.

* cited by examiner

*Primary Examiner*—Mark Budd
(74) *Attorney, Agent, or Firm*—Fitzpatrick, Cella, Harper & Scinto

(57) ABSTRACT

To provide a film forming method capable of obtaining a high-quality perovskite type oxide thin film, piezoelectric element having a piezoelectric substance constituted of the thin film formed by the film forming method, liquid discharge head having the piezoelectric element and liquid discharge apparatus having the liquid discharge head. A method for forming a perovskite type oxide thin film having a composition expressed by $(A1_x, A2_y, A3_z)(B1_j, B2_k, B3_l, B4_m, B5_n)O_p$ is included, which is a film forming method having a plurality of steps for supplying a material containing the elements onto the substrate, dividing the elements A1 to A3 and B1 to B5 into a plurality of groups and supplying each material containing the elements included in the groups onto the substrate in separate steps.

6 Claims, 10 Drawing Sheets

METHOD FOR FORMING PEROVSKITE TYPE OXIDE THIN FILM, PIEZOELECTRIC ELEMENT, LIQUID DISCHARGE HEAD, AND LIQUID DISCHARGE APPARATUS

BACKGROUND OF THE INVENTION

1. Field of the Invention

The present invention relates to a method for forming a perovskite type oxide thin film having a plurality of A-site elements or B-site elements, piezoelectric element having a piezoelectric substance constituted of a perovskite type oxide thin film formed by the film forming method, liquid discharge head having the piezoelectric element, and liquid discharge apparatus having the liquid discharge head.

2. Description of the Related Art

Recently, researches of a ferroelectric thin film and piezoelectric electrostriction thin film are frequently performed as application to an FeRAM, application to an optical shutter and optical communication, and application to a piezoelectric actuator. In this case, as a material having a large piezoelectric characteristic, a relaxor state of single crystal material is reported. It is said that the relaxor state of single crystal material shows a large piezoelectric characteristic for the azimuth (100) of rhombohedral. The relaxor state of single crystal material is made by a fusion method such as a flux method or bridgman method (Non-patent Document 1). Therefore, it is necessary to cut, work, and join a single crystal material to form it into a device and its size is limited. For example, there are problems that it is impossible to develop a micromachine (MEMS; Micro Electro Mechanical System) to a minute device or it is impossible to obtain a long ink-jet head. Moreover, Ruddelsdon-popper-type oxide and Bi-layer-like compound are noticed as non-lead-based piezoelectric materials including the purpose to an FeRAM.

Furthermore, it is conventionally difficult to form a relaxor state of single crystal known as zinc niobate titanate (may be shown as PZN—PT) in the case of the sputtering method or sol-gel method. The reasons are shown below.

In the case of film formation by pulse-laser vapor deposition method (may be shown as PLD method) or sputtering method, due to absence of ceramics, a target material uses a bulk state of single crystal material which is expensive. Moreover, it is difficult to work a single crystal material because it has an insufficient mechanical strength and its workability is not preferable as a target.

In the case of the sol-gel method or metal organic-compound deposition method (may be shown as MOD method), there are problems that it is difficult that the organic-metal compound of Zn which is a material is melted in a solvent when it is coexistent with other material and it is impossible to form a composition in which the content of Zn element is increased into a film.

[Non-patent Document 1] S. E. Park, [Ultrahigh strain and piezoelectric behavior in relaxor based ferroelectric single crystals], Journal of Applied Physics (J. Appl. Phys.), 1997, Volume No. 82, No. 4, p. 1804

SUMMARY OF THE INVENTION

Therefore, it is an object of the present invention to provide a method for forming a perovskite type oxide thin film having a plurality of A-site or B-site elements without a different phase such as a pyrochlore phase and having preferable crystallinity at a high reproducibility. Moreover, it is another object of the present invention to provide a piezoelectric element provided with a piezoelectric substance having a large piezoelectricity constituted of a perovskite type oxide thin film formed through the film forming method, liquid discharge head having the piezoelectric element and liquid discharge apparatus having the liquid discharge head.

The present invention solving the above problems is a method for forming a perovskite type oxide thin film having a plurality of elements constituting at least one of A site and B site on a substrate, in which the perovskite oxide is expressed by the following chemical formula (1), that is, $(A1_x, A2_y, A3_z)(B1_j, B2_k, B3_l, B4_m, B5_n)O_3$ (where, element A1 shows Pb and elements A2 and A3 are different from each other and respectively show any one of Bi, Ba, Sr, Ca and La; elements B1, B2, B3, B4 and B5 are different from each other and respectively show any one of Nb, Yb, Mg, Zn, Sc, Ta, Ti, Zr, In and Ni; x, y and z are real numbers between 0 and 1 (inclusive) satisfying the relation expressed by $x+y+z \geqq 1.0$; and j, k, l, m and n are real numbers between 0 and 1 (1 is excluded) satisfying the relation expressed by $j+k+l+m+n=1$), a plurality of steps of supplying materials containing the elements onto the substrate are included, the A1, A2, A3, B1, B2, B3, B4 and B5 are divided into a plurality of groups and materials containing elements included in the groups are supplied onto the substrate in separate steps every material containing elements included in the groups.

Moreover, the present invention solving the above problems is a piezoelectric element having a piezoelectric substance constituted of a perovskite type oxide thin film formed by the film forming method of the present invention and a pair of electrodes contacting with the piezoelectric substance.

Furthermore, the present invention solving the above problems is a liquid discharge head having a discharge port, a separate liquid chamber in communication with the discharge port, piezoelectric element provided correspondingly to the separate liquid chamber and vibration plate set between the separate liquid chamber and the piezoelectric element to discharge the liquid in the separate liquid chamber from the discharge port in accordance with a volume change in the separate liquid chamber caused by the vibration plate, in which the piezoelectric element is the piezoelectric element of the present invention.

Furthermore, the present invention solving the above problems is a liquid discharge apparatus having the liquid discharge head of the present invention.

As described above, the present invention is a new film forming method for obtaining a perovskite type oxide thin film which can be applied to various dielectric devices in accordance with electrical and/or optical compositions or composition. Also when using a film forming method of the present invention for a composition in which a pyrochlore phase easily enters, it is possible to obtain a perovskite type oxide single crystal thin film having a preferable crystallinity, single-orientation crystal thin film or polycrystal thin film. Moreover, the film forming method is a method capable of using the organic-metal chemical vapor deposition method (may be referred to as MO-CVD method), sol-gel method or MOD and obtaining a high-quality relaxor thin film. Particularly, the film forming method is a film forming method preferred to form an $ABO_3$ perovskite type oxide thin film.

Moreover, by using a piezoelectric substance constituted of a perovskite type oxide thin film formed by the above film forming method, a piezoelectric element having a large piezoelectricity can be obtained. Furthermore, by using a piezoelectric element of the present invention, it is possible to obtain a liquid discharge head showing a uniform and high discharge performance and capable of performing minute patterning and a liquid discharge apparatus having the liquid discharge head.

Further features of the present invention will become apparent from the following description of exemplary embodiments with reference to the attached drawings.

DESCRIPTION OF THE EMBODIMENTS

Figure 1:
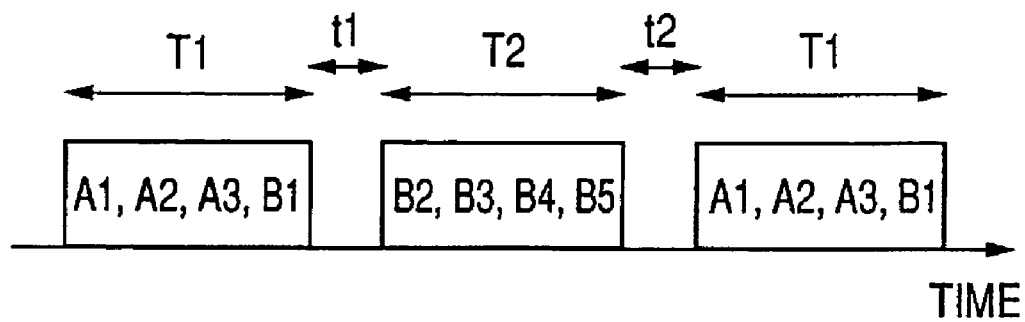
FIG. 1 is an illustration for explaining a material supplying method of an embodiment of a film forming method of the present invention using the MO-CVD method.

The present invention is described below in detail.

A film forming method of the present invention is a method for forming perovskite type oxide thin film having a plurality of elements constituting at least one of A site and B site on a substrate.

The perovskite oxide is expressed by the following chemical formula.

$(A1_x, A2_y, A3_z) (B1_j, B2_k, B3_l, B4_m, B5_n)O_3$ (1) (where, element A1 shows Pb and elements A2 and A3 are different from each other and respectively show any one of Bi, Ba, Sr, Ca and La. Elements B1, B2, B3, B4 and B5 are different from each other and respectively show any one of Nb, Yb, Mg, Zn, Sc, Ta, Ti, Zr, In and Ni. Symbols x, y and z show real numbers between 0 and 1 (inclusive) and satisfy the relation expressed by $x+y+z \geqq 1.0$. Symbols j, k, l, m and n show real numbers between 0 and 1 (inclusive) and satisfy the relation expressed by $j+k+l+m+n=1$. In the above chemical formula (1), oxygen composition is set to 3. However, it is allowed that an oxygen composition ratio changes in a range in which a characteristic is not fluctuated and ranges between 1.5 and 3.5 (inclusive). A film forming method of the present invention has a plurality of steps of supplying materials containing the elements onto the substrate, divides A1, A2, A3, B1, B2, B3, B4 and B5 into a plurality of groups and supplies each material containing elements included in the groups onto the substrate in separate steps. It is assumed that a group of the present invention is a group in which one or more elements is or are selected.

It is preferable that a film forming method of the present invention has a plurality of material supply steps a plurality of times. The specific description will be made below.

[When there are a Plurality of B-site Elements]

It is preferable to supply at least one of materials of B-site elements (B1, B2, B3, B4 and B5) separately from other B-site elements. That is, when there are a plurality of B-site elements, it is only necessary to group B-site elements so that they are included in a plurality of groups. For example, when assuming element B1 as Ti, it is necessary to separate a group including Ti from a group including other B-site elements Nb, Yb, Mg, Zn, Sc, Ta, Zr, In and Ni. Moreover, it is preferable that A-site element A1 is included in the same group as B-site elements. Then, a step I of supplying a material containing B1-site element to a substrate and a step II of supplying a material containing other B-site element and A-site element are included. It is also allowed to further divide step II into a plurality of steps and it is preferable to alternately repeat these steps.

By using a case of forming a perovskite type oxide thin film having a plurality of B-site elements (B1, B2 and B3) as an example as expressed by A1 (B1, B2 B3)$O_3$, the present invention is specifically described.

The above A- and B-site elements are divided into group I (A1 and B1) and group II (B2 and B3) and a material containing elements of each group is supplied to a substrate in separate step every group. Moreover, it is allowed to divide groups into group I[A1], group II[B1] and group III[B2 and B3] or divide them into group [A1] and group II[B1, B2 and B3].

An example including a plurality of B-site elements is shown above. However, when there are a plurality of A-site elements and there is only one B-site element, the above description is the same as the description in which A and B are replaced each other. Therefore, the description is omitted.

[When there are a Plurality of A-site Elements and a Plurality of B-site Elements]

Then, by using a case of forming a perovskite type oxide thin film having a plurality of A-site elements (A1 and A2) and a plurality of B-site elements (B1 and B2) expressed by (A1 and A2) (B1 and B2)$O_3$ as an example, the present invention is specifically described below.

First, the above-described A- and B-site elements are divided into four groups of group I(A1), group II(A2), group III(B1) and group IV(B2) to supply a material containing elements of the groups to a substrate.

For example as the sequence of material supplying steps, the material of group I(A1) is supplied in the first material supplying step. Then, the material of group III(B1) is supplied in the second material supplying step, the material of group II(A2) is supplied in the third material supplying step and the material of group IV(B2) is supplied in the fourth material supplying step. It is allowed to change this sequence and it is possible to easily form a thin film having a predetermined thickness by repeating these steps.

Moreover, to separately supply element B1 and element B2 onto a substrate, it is allowed to divide the element B1 and element B2 into group I(A1 and B1) and group II(A2 and B2) and supply a material containing element of each group to a substrate in separate steps. Furthermore, it is allowed to divide the elements into three groups and supply them to a substrate in separate steps. A combination is not restricted to the above case.

[When Including Elements Having Different Valences in Same Site]

Furthermore, a perovskite type oxide thin film expressed by (A1, A2)(B1, B2)O$_3$ and in which the valence of element A1 is different from the valence of element A2 is described as an example.

It is preferable that elements A1 and A2 are included in the same group and group I(A1 and A2) and group II(B1 and B2) are separately supplied to a substrate in separate steps. In this case, it is allowed to divide group II(B1 and B2) into group (B1) and group(B2). Moreover, it is allowed to divide group II(B1 and B2) into group I(A1, A2 and B1 (or group B2)). As a specific example in which A-site elements are different from in each other valence, A1 element is Pb and Bi and La are assumed as elements different from each other in valence and it is only necessary to include Bi and La in the same group as Pb and supply them to a substrate at the same time.

In the above description, an example in which A-site elements are different from each other in valence is shown. However, the same is applied to a case in which B-site element is different from each other in valence. Moreover, it is allowed that there are three types of more of A-site and B-site elements.

Description is made in accordance with a specific example. In general, when site elements are different from each other in valence, oxygen ions and electrical neuter are secured base on a composed proportion of elements. For example, in the case of Pb(Zn$_x$, Nb$_{1-x}$)O$_3$ expressed by A1(B1, B2)O$_p$, Zn of element B1 is bivalent, Nb of element B2 is pentavalent and Pb of element B1 is bivalent (2+). Therefore, it is preferable that B site has quadrivalent (4+) for Zn and Nb. Thus, it is preferable that x in the above chemical formula becomes ⅓. When x becomes ⅓, the valence of B-site element becomes quadrivalent (4+). Because the valence becomes 6+ by including Pb of A-site element. Therefore, the valence becomes electrical neutral wit 6− of O$_3$ and the withstand property of a film is improved. However, when dividing Zn of element B1 and Nb of element B2 into separate groups and supplying them to a substrate in separate steps, the element easily enters B site in accordance with a supplied quantity. Therefore, a film which is not electrically neutral is formed and may become a film having a low withstand voltage property.

According to a film forming method of the present invention, to simultaneously supply elements having different valency (e.g. Zn and Nb in the above example), it is possible to introduce electrical neuter, that is, Nb at a rate of 2 atom mole to 1 atom mole of Zn. Therefore, an electrical-neutral film is realized and a film having a high withstand voltage property is obtained.

As described above, to form a neutral film having a high withstand voltage property, it is necessary to control an element ratio. Particularly, when a plurality of elements are included in the same site and valences of the elements are different, it is necessary to more severely control the element ratio. Therefore, it is only necessary to group elements having different valences in the same site so as to be included in the same group. Thereby, it is possible to control an element ratio when simultaneously supplying the elements and form a neutral film having a high withstand voltage property.

A film forming method of the present invention is different from a method for forming a film by using a PbTiO3 layer realized when forming a Pb(Zr and Ti)O$_3$ thin film as an anchor layer apart from a layer configuration.

As described above, the present invention is a method for obtaining an integrated thin film by supplying materials divided into groups in separate steps and temporally dividing the materials, supplying and forming films. Supply of materials is temporally divided into a plurality of steps because a thin film having a preferable film quality cannot be obtained when a film formed by one-time material supply is thick. However, by supplying materials in a plurality of steps, for example, alternately temporally supplying the materials, film thicknesses formed by the materials are integrated and a thin film having a preferable crystallinity is obtained. To realize the above mentioned, it is preferable that a film thickness formed by one-time material supply is minimized, that is, a film thickness of 10 nm or less or 3 nm or less is preferable. Moreover, to bring a film formed in a plurality of supplying steps to a uniform film as a whole, it is only necessary to form a film while heating a substrate or execute a heating step after film forming steps. Detailed substrate temperature is described below. By heating the substrate, diffusion of elements occurs in a plurality of films formed on the substrate and a film uniform as a whole can be formed.

Thereby, it is possible to not only restrain an unexpected reaction between materials when supplying materials but also obtain a thin film having a preferable crystallinity. Particularly, a film forming method of the present invention can be preferably applied to film formation when there are a plurality of B-site elements.

The above film forming method of the present invention is a film forming method capable of obtaining, and controlling the composition of, a preferable perovskite thin film and a film forming method capable of obtaining a single crystal thin film of a relaxor thin film and single-orientation-crystal thin film. Particularly, the method is a technique capable of forming a thin film having the composition of a morphotoropic-phase interface region (may be referred to as MPB region) of a thin film constituent of metallic elements of Pb, Zn, Nb and Ti known as PZN—PT among relaxor materials.

Moreover, it is preferable that a perovskite type oxide thin film obtained from a film forming method of the present invention has a thickness between 50 nm and 10 μm (inclusive) and can be preferably used as a dielectric, discharge port, or pyroelectric ferroelectric.

In the case of a conventional film forming method for simultaneously supplying all materials, there is a problem that a pyrochlore phase is included in a thin film and a characteristic is deteriorated. However, according to a film forming method of the present invention, it is possible to solve the problem. Moreover, in the case of the conventional sol-gel method and MOD method, it is difficult to control the composition of Zn because of the problem of insufficient solubility in an organic solvent of Zn material. However, it is possible to solve this problem by a film forming method of the present invention.

According to a film forming method of the present invention, it is possible to form a perovskite type oxide thin film of a relaxor thin film.

In the case of a film forming method of the present invention, it is preferable to use an organic metal chemical vapor deposition method (may be referred to as MO-CVD method), sol-gel method and MOD method. Among these methods, it is preferable to use the MO-CVD method.

Thin films having the following compositions are relaxor thin films which can be formed by a film forming method of the present invention.

For example, the compositions are PB(Mg, Nb)O$_3$—PbTiO$_3$, Pb(Zn, Nb)O$_3$—PbTiO$_3$, Pb(Yb, Nb)O$_3$—PbTiO$_3$, Pb(In, Nb)O$_3$—PbTiO$_3$, Pb(Ni, Nb)O$_3$—PbTiO$_3$ and Pb(Sc, Ta)O$_3$—PbTiO$_3$, Pb(Sc, Nb)O$_3$—PbTiO$_3$. In the case of MBP regions of the above materials, contents of PbTiO3 are 33 mole %, 9 mole %, 47 mole %, 36 mole %, 30 mole %, 45 mole % and 45 mold %. Among these contents, only the MPB region of PZN—PT is 10 mole % or less and therefore, it is requested to raise contents of Zn and Nb. Therefore, a high solubility or a high material supply quantity in a film forming step is requested for these materials. The MO-CVD method capable of optionally controlling the material supply quantity is a preferable film forming method because it is able to easily correspond to the above request. However, also in the case of the MO-CVD method as with conventional techniques, a perovskite phase cannot be obtained by only supplying all materials described above at the same time. Therefore, a film forming method of the present invention using the MO-CVD method is necessary. It is allowed to use a film composition such as PZN—PZT containing Zr as a B-site element. However, it is preferable to use a composition not containing Zr like PZN—PT. When Zr is contained, Curie temperature lowers and therefore, the composition may not be usable in a practical temperature range.

Moreover, the MOD method uses a material different from the case of the sol-gel method but the film forming process is the same. The MOD method typically has an applying step of applying a material solution to a substrate, drying step of drying the applied material solution, preliminary heating step of preliminarily heating the dried material film and a crystallizing step of heating and crystallizing an oxide film obtained through calcination. It is necessary that a material used for the MOD method is dissolved. Therefore, a high solubility is requested for the material. Moreover, it is preferable to perform all material supplying steps at least once before starting the preliminary heating step. To use the MOD method for the present invention is useful in the same meaning as the case of the sol-gel method.

In the case of a film forming method of the present invention, when separately supplying at least one of elements B1, B2, B3, B4 and B5, it is preferable to supply at least one of these materials onto a substrate together with Pb of A-site element. In this case, it is preferable that at least one of other B-site materials is not included in Pb without mixing it with Pb of the A-site element. This is because Ti of B-site element easily becomes a perovskite phase together with Pb but B-site elements other than Ti hardly takes a perovskite phase and it is preferable to supply Pb together with Ti. To realize this, it is preferable to supply Pb together with the quantity of Pb to other B-site element when supplied.

FIG. 1 shows an embodiment of a film forming method of the present invention using the MO-CVD method. In the case of the embodiment shown in FIG. 1, source gases of elements A1, A2, A3 and B1 are supplied and then, source gases of elements B2, B3, B4 and B5 are supplied. By repeating these steps, it is possible to control a film thickness. It is preferable that a substrate is heated when a material is supplied. Moreover, as shown in FIG. 1, to stop material supply for a certain time in each material supplying step and set no-supply times (t1 and t2) is preferable to improve the crystallinity of an obtained thin film and film density. It is allowed that the times t1 and t2 are equal or different. It is normally preferable to set the times t1 and t2 to 1 to 100 sec and more preferable to set the times to 2 to 60 sec. It is preferable to enclose oxygen gas when supplying a source gas. The partial pressure of oxygen gas normally ranges between 66 Pa and 6.7 kPa, preferably ranges between 130 Pa and 2.7 kPa. It is also allowed to introduce an inert gas such as argon gas, nitrogen gas or neon gas other than oxygen gas. It is preferable to normally set material supply times (T1 and T2) to 1 to 200 sec and more preferable to set the times to 5 to 100 sec. FIG. 1 shows an embodiment for repeating two different material supplying steps but it is also allowed to use an embodiment for repeating three or more different material supplying steps. To form a PZN—PT thin film, it is preferable to supply Pb and Ti in a first step (corresponding to time T1) and supply Zn and Pb in a second step. By repeating these steps, it is possible to easily form a perovskite type oxide thin film having a thickness of 1 μm or more. In this case, it is preferable that the supply quantity of Pb in the first step includes the quantity necessary for Zn and Nb in the second step. It is possible to adjust the supply quantity of a source gas in accordance with the material supply times (T1 and T2) in each material supplying step, source gas concentration or repetition times of each material supplying step.

Moreover, as described above, in the case of the present invention, it is preferable to form a film by heating a substrate and supplying a material onto the heated substrate. When using the sol-gel method or MOD method, it is preferable that the heating temperature is normally no less than 50° C. and preferably no less than 100° C., and the heating temperature is normally no more than 400° C. and preferably no more than 200° C. Moreover, when using the MO-CVD method, it is preferable that the heating temperature is normally no less than 200° C. and preferably no less than 400° C., and the heating temperature is normally no more than 800° C. and preferably no more than 700° C.

A film forming step of an embodiment of a conventional film forming method using the sol-gel method or MOD method is described below by referring to FIG. 2. In the case of the embodiment of the conventional film forming method shown in FIG. 2, when forming a film of PZN—PT, a solution containing all materials of Pb, Zn, Nb and Ti is adjusted and applied by a spin computer or the like. Then, the solution is calcinated to remove organic components and moreover heated to a temperature equal to or higher than the temperature at the time of calcination and crystallized to obtain a crystal thin film of PZN—PT. By repeating this operation, a thin film having a predetermined thickness is formed.

Embodiments of a film forming method of the present invention using the sol-gel method or MOD method are described below by referring to FIGS. 3 and 4.

Figure 3:
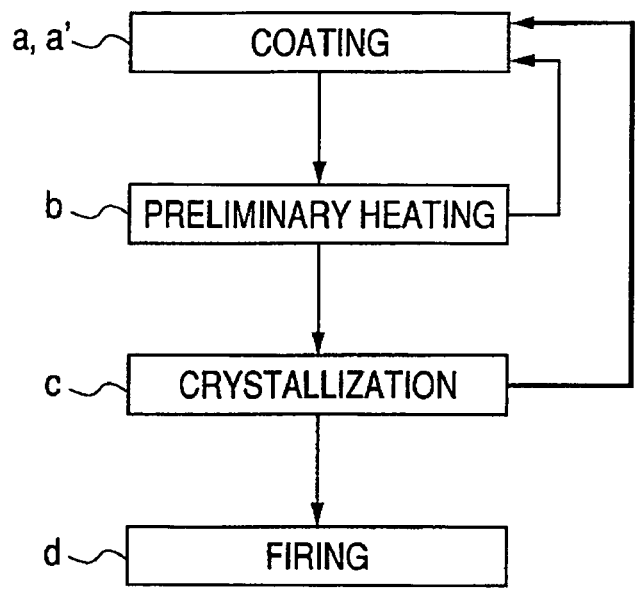
FIG. 3 is an illustration for explaining an embodiment of a film forming method of the present invention using the sol-gel method or MOD method.

In the case of the embodiment shown in FIG. 3, for example, when forming a PZN—PT thin film, a solution containing Pb and Ti is applied in an applying step (a) and calcinated in a preliminary heating step (b). Thereafter, a solution containing Zn and Nb is applied on the solution in an applying step (a') and calcinated in the preliminary heating step (b). It is preferable to set the preliminary heating step (b) after the applying steps (a) and (a') in order to avoid that the applying steps (a) and (a') are continuously performed. After repeating the above steps a plurality of times, the solution is heated up to a temperature equal to or higher than the temperature in the preliminary heating step in a crystallizing step (c) and crystallized. The above steps are repeated a plurality of times if necessary. Finally, to improve the crystallinity of the whole film, the solution is fired at a temperature equal to or higher than the temperature in the crystallizing step (c) in a firing step (d) to form a PZN—PT thin film having a predetermined thickness.

Figure 4:
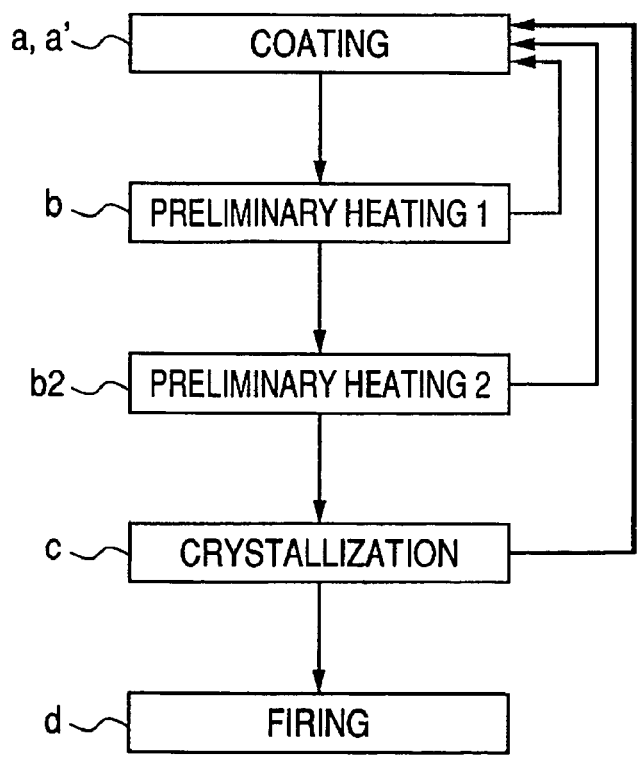
FIG. 4 is an illustration for explaining an embodiment of a film forming method of the present invention using the sol-gel method or MOD method.

In the case of the embodiment shown in FIG. 4, a solution containing Pb and Ti is applied in the applying step (a) similarly to the case of the embodiment shown in FIG. 3 and calcinated in the preliminary heating step (b) to form a thin film. A solution containing Zn and Pb is applied onto the above solution in the applying step (a') and calcinated in a preliminarily heating-1 step (b). It is preferable to perform the preliminarily heating-1 step (b) after the applying steps (a) and (a') in order to avoid that applying steps (a) and (a') are continuously performed. After repeating the above steps a plurality of times, the solution is further calcinated in a preliminarily heating-2 step (b2). The above steps are repeated a plurality of times if necessary. Thereafter, in the crystallizing step (c), the solution is heated to a temperature equal to or higher than the temperature in a preliminarily heating-2 step (b2) and crystallized. It is allowed to repeat the above steps a plurality of times if necessary.

Figure 2:
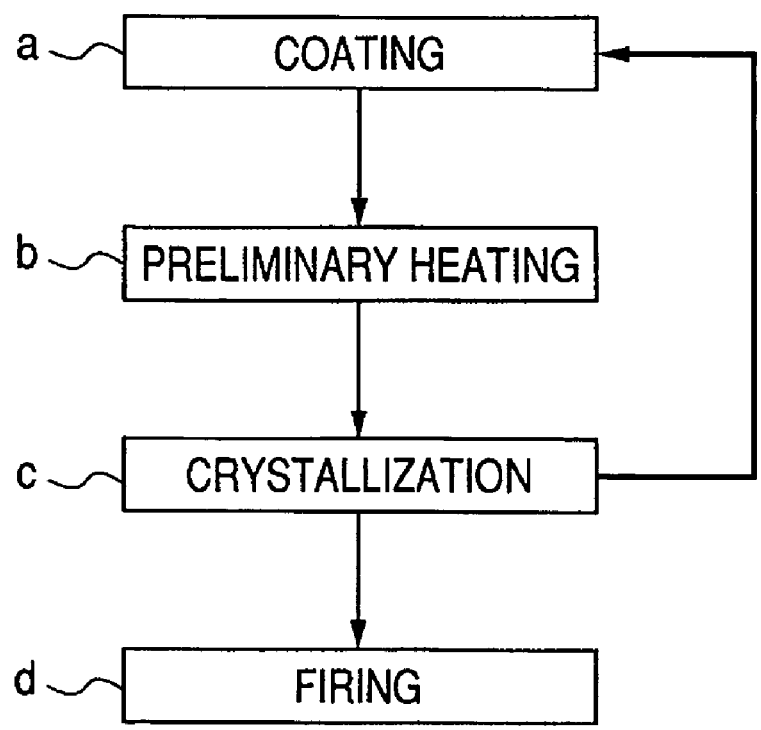
FIG. 2 is an illustration for explaining a conventional film forming method using the sol-gel method or MOD method.

Embodiments of the present invention shown in FIGS. 3 and 4 are different from the embodiment of the conventional example shown in FIG. 2 in that a step of supplying at least one of B-site elements (or A-site elements) onto a substrate separately from other B-site materials (or A-site materials).

In the applying steps (a) and (a'), it is possible to use application method such as spin application, curtain coat, dip coat, roll coat or die coat. It is preferable to use the spin application method capable of forming a thin film. When a film forming method is a film forming method using the sol-gel method or MOD method, it is not necessary to heat a substrate at the time of application. When using these film forming methods, it is possible to correspond to crystallinity control in the preliminary heating step (b) or (B2) or crystallizing step (c).

In the preliminary heating step (b) or (b2), calcination is normally performed at 300° C. or higher, preferably 350° C. or higher. Moreover, calcination is normally performed at 550° C. or less and preferably at 450° C. or lower. When setting a calcination temperature to 300° C. or higher, it is possible to easily completely remove organic components. Moreover, when setting the calcination temperature to 550° C. or lower, it is possible to prevent partial cystallization and thereby, quickly perform crystallization in the next crystallizing step.

A material compound used for the present invention is a heat-decomposable metallic compound.

As a heat-decomposable metallic compound, it is possible to use any one of alkyl metallic compound, alkoxy metallic compound, alkoxy alkyl metallic compound, diketone compound, olefin compound and halogen compound. As the alkyl metallic compound, it is preferable to use an alkyl metallic compound having an alkyl group having an alkyl group up to carbon number of 22 such as methyl, ethyl, isopropyl, butyl, isobutyl, t-butyl, sec-butyl, pentyl, isopentyl, hexyl, octyl, dodecyl or behenyl. Moreover, as an alkoxy metallic compound, it is preferable to use an alkoxy metallic compound having an alkoxy group of up to carbon number of 22 such as methoxy, ethoxy, propoxy, isopropoxy, butoxy, t-butoxy, sec-butoxy, hexyloxy or dodecyloxy. As an alkoxyalkyl metallic compound, it is preferable to use alkoxyalkyl metallic compound having a methoxymethyl, methoxyethyl, propoxymethyl or propoxybutyl.

Furthermore, as a diketone compound, it is preferable to use a metallic compound having acetylacetone, 6-ethyl-2,2-dimethyl-2,5-decandion (abbreviated as EDMDD) or bis(dipivaloyl)methanate (abbreviated as thd) as a substituent group or ligand. Furthermore, as an olefin compound, it is preferable to use a metallic compound having cyclopentadiene, methylcyclopentadiene, ethylcyclpentadiene, propylcyclopentadiene, cyclohexadiene or cyclooctadiene as a ligand.

As a halogen compound, it is preferable to use a metallic halogen compound such as any one of chloride, bromide, fluoride or iodide.

It is allowed to use a halogen compound having the same type of substituent group or ligand or a plurality of different substituent groups or ligands.

A perovskite type oxide thin film obtained by a film forming method of the present invention is a thin film to be preferably used as a piezoelectric element or electrostriction element. In the case of a film forming method of the present invention, a thin film is normally formed on a substrate. As a substrate used for the present invention, it is preferable to use a substrate having a heat resistant temperature of 600° C. or higher such as a Si substrate, MgO substrate, STO substrate, SUS substrate or Ti foil. When forming a single crystal perovskite type oxide thin film or single-orientation perovskite type oxide thin film by a film forming method of the present invention using the MO-CVD method, it is preferable to use an Si substrate on which an epitaxial layer is formed as a ground layer. Moreover, it is preferable to use an $SrTiO_3$ single crystal substrate or MgO single crystal substrate.

[Piezoelectric Element]

An embodiment of a piezoelectric element of the present invention is described below by referring to the accompanying drawings.

Figure 5:
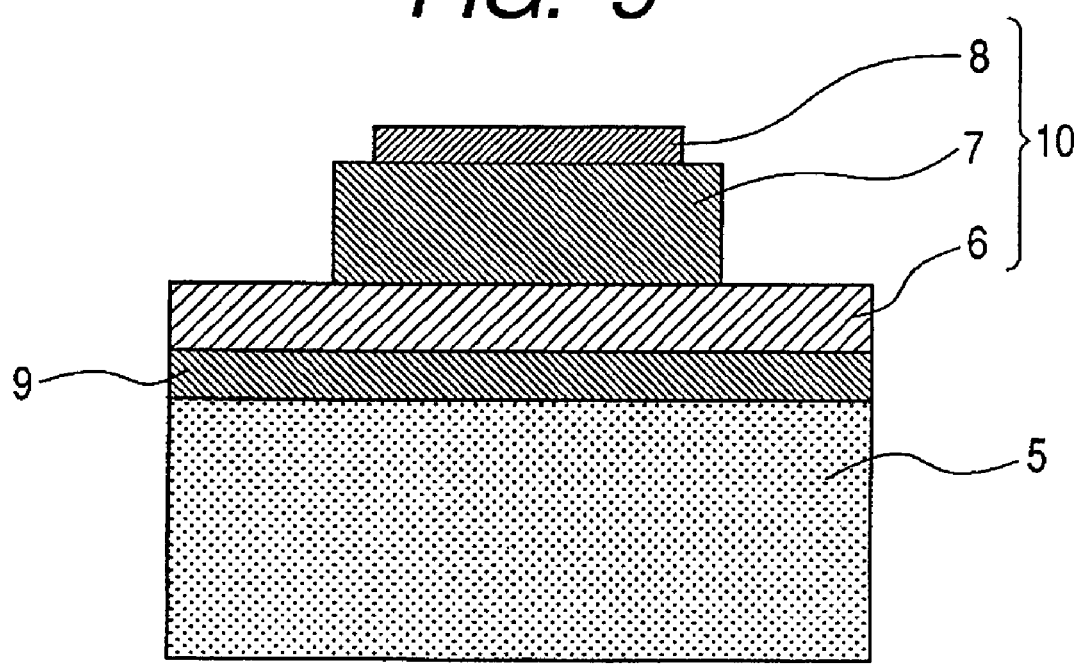
FIG. 5 is a schematic view showing an embodiment of a piezoelectric element of the present invention.

FIG. 5 shows a sectional schematic view of an embodiment of a piezoelectric element of the present invention. The piezoelectric element 10 of the present invention is a piezoelectric element including at least first electrode film 6, piezoelectric substance 7 constituted of a perovskite type oxide thin film formed by a film forming method of the present invention and second electrode film 8. In the case of the piezoelectric element of the embodiment shown in FIG. 5, the sectional shape of the piezoelectric element 10 is rectangular. However, it is allowed to use a trapezoid or inverted trapezoid. Though the piezoelectric element 10 of the present invention is formed on a substrate 5, it is allowed to use the first electrode film 6 and second electrode film 8 constituting the piezoelectric element 10 of the present invention as a lower electrode or upper electrode. This depends on a fabrication method for change to a device and it is possible to obtain the advantage of the present invention from the both electrodes. Moreover, it is allowed that a buffer layer 9 is present between the substrate 5 and the first electrode film 6.

It is possible to form the piezoelectric element 10 of the present invention by using the substrate 5 or the substrate 5 having the previously-formed buffer layer 9. It is possible to fabricate the piezoelectric element 10 by forming the first electrode film 6 on the substrate 5 or the buffer layer 9 of the substrate 5, forming a perovskite type oxide thin film on the film 6 by a film forming method of the present invention as a piezoelectric substance 7 and forming the second electrode film 8.

It is preferable that the first electrode film (electrode) or second electrode film (electrode) of a piezoelectric element of the present invention has a preferable adhesiveness with the above-described piezoelectric substance and is constituted of a material having a high conductivity. Specifically, for example, it is preferable that the first or second electrode film is constituted of a material capable of setting the resistivity of an upper or lower electrode film to $10^{-7}$ to $10^{-2}$ Ω·cm. This material frequently uses a metal in general. However, it is preferable to use a metal in Pt group such as Au, Ag, Cu, Ru, Rh, Pd, Os, Ir or Pt as an electrode material. Moreover, it is possible to preferably use an alloy material such as any one of silver paste and solder containing the above material because they have a high conductivity. Furthermore, for example, conductive oxide materials such as $IrO_x$ (iridium oxide), SRO (strontium ruthenate), ITO (conductive tin oxide) and BPO (barium plumbate) are preferable as conductive materials. Furthermore, it is allowed that an electrode film is constituted of one layer or many layers. For example, the electrode film may be constructed as Pt/Ti in order to enhance adherence to the substrate. When a substrate itself is conductive like a Ti foil, it is allowed to exclude a first electrode. It is preferable to normally set the thickness of an electrode film between 20 nm and 1,000 nm, more preferably set the thickness between 100 and 400 nm. When setting the thickness of an electrode film to 20 nm or more, the resistance of the electrode film becomes small enough and setting the thickness to 1,000 nm or less is preferable because the piezoelectric property of a piezoelectric element is not impaired.

Though an electrode-film forming method of the present invention is not restricted, it is possible to normally form an electrode film of 1,000 nm or less by using the thin film forming method such as the sol-gel method, hydrothermal synthesis method, gas deposition method or electrophoresis method. Moreover, it is possible to form the film by using a thin film forming method such as any one of the sputtering, chemical vapor deposition (or CVD), MO-CVD method, ion-beam deposition method, molecular-beam epitaxy method and laser ablation method. In the case of these thin-film forming methods, because change of an electrode film using the epitaxial grown from a substrate or buffer layer to one-axis orientation or single crystallization can be made, one-axis orientation or single crystallization of a piezoelectric substance becomes easy.

Then, a liquid discharge head of the present invention is described below.

The liquid discharge head of the present invention has a discharge port, a separate liquid chamber in communication with the discharge port, piezoelectric element provided correspondingly to the separate liquid chamber and vibration plate set between the separate liquid chamber and the piezoelectric element. Moreover, the head has a feature that the liquid in the separate liquid chamber is discharged from the discharge port due to a volume change of the separate liquid chamber caused by the vibration plate and the piezoelectric element is a piezoelectric element of the present invention.

By using a piezoelectric element of the present invention as a piezoelectric element, it is possible to easily obtain a liquid discharge head showing a uniform and high discharge performance and capable of performing minute patterning. A liquid discharge head of the present invention can be used for an image forming apparatus such as an ink-jet printer, Fax, composite machine or copying machine or industrial discharge apparatus for discharging a liquid other than ink.

[Liquid Discharge Head]

Figure 6:
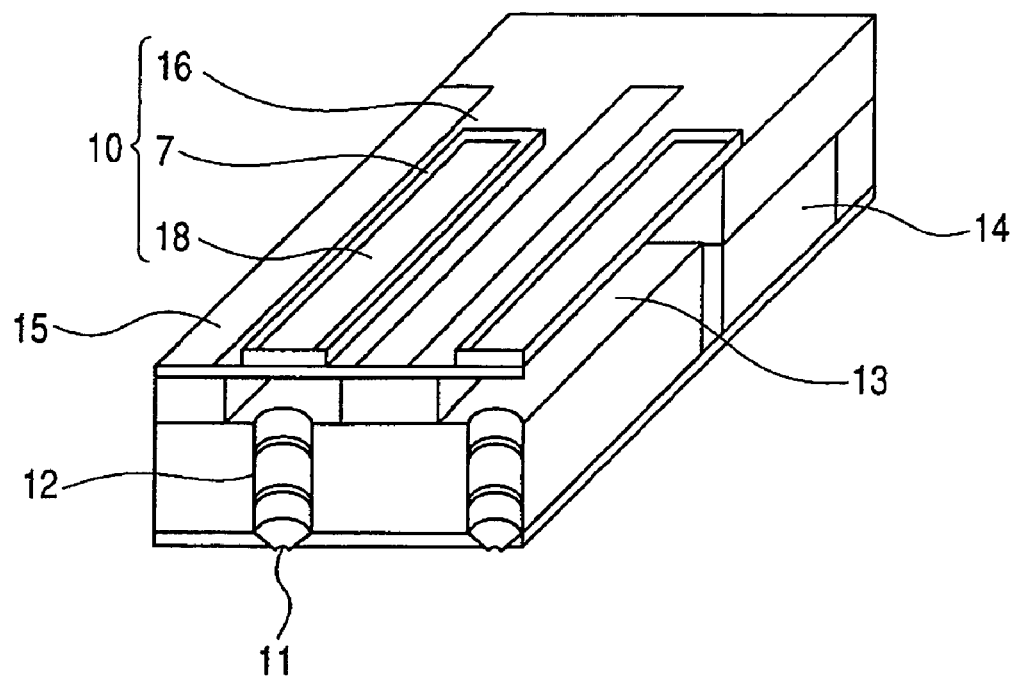
FIG. 6 is a schematic view showing an embodiment of a liquid discharge head of the present invention.

A liquid discharge head of the present invention is described below by referring to FIG. 6. FIG. 6 is a schematic view showing an embodiment of a liquid discharge head of the present invention. The liquid discharge head of the embodiment shown in FIG. 6 is provided with a discharge port 11, communication hole 12 for communicating the discharge port 11 with a separate liquid chamber 13 and common liquid chamber 14 for supplying liquid to the separate liquid chamber 13 and the liquid is supplied to the discharge port 11 along the communicated route. A part of the separate liquid chamber 13 is constituted of the vibration plate 15. The piezoelectric element 10 for providing vibration for the vibration plate 15 is set outside of the separate liquid chamber 13. When the piezoelectric element 10 is driven, the vibration plate 15 causes a volume change in the separate liquid chamber 13 to which vibration is provided by the piezoelectric element 10 and thereby, the liquid in the separate liquid chamber 13 is discharged from the discharge port. Though the piezoelectric element 10 is rectangular in the embodiment shown in FIG. 6, it is allowed to change this shape to an ellipse, circle or parallelogram.

Figure 7:
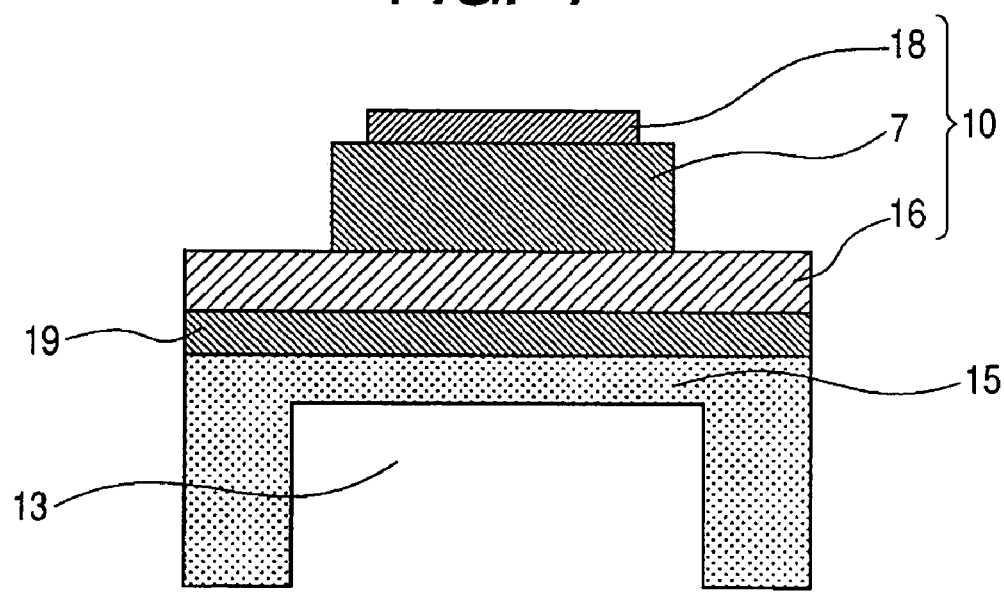
FIG. 7 is a sectional schematic view of the liquid discharge head in FIG. 6 in the width direction.

FIG. 7 shows a sectional schematic view of the liquid discharge head shown in FIG. 6 in the width direction. By referring to FIG. 7, the piezoelectric element 10 constituting a liquid discharge head of the present invention is further minutely described below. Though the sectional shape of the piezoelectric element 10 is shown as a rectangle, a trapezoid or inverted trapezoid is also allowed. Moreover, in FIG. 7, the first electrode film 6 corresponds to a lower electrode film 16 and the second electrode film 8 corresponds to an upper electrode film 18. However, it is allowed that the first electrode film 6 and second electrode film 8 constituting the piezoelectric element 10 of the present invention conform to either of the lower electrode film 16 and upper electrode film 18. This depends on a fabrication method at the time of change to a device and it is possible to obtain the advantage of the present invention from the film 16 or 18. Moreover, it is allowed that the vibration plate 15 is formed of the substrate 5 constituting the piezoelectric element 10 of the present invention. Furthermore, it is allowed that the buffer layer 19 is present between the vibration plate 15 and the lower electrode film 16.

Figure 8:
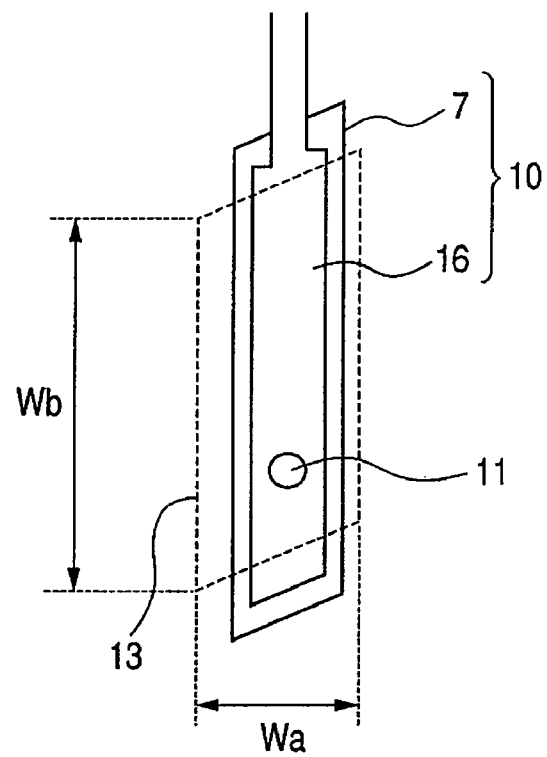
FIG. 8 is a schematic view of the liquid discharge head in FIG. 6 viewed from the upside (discharge port side).
Figure 9:
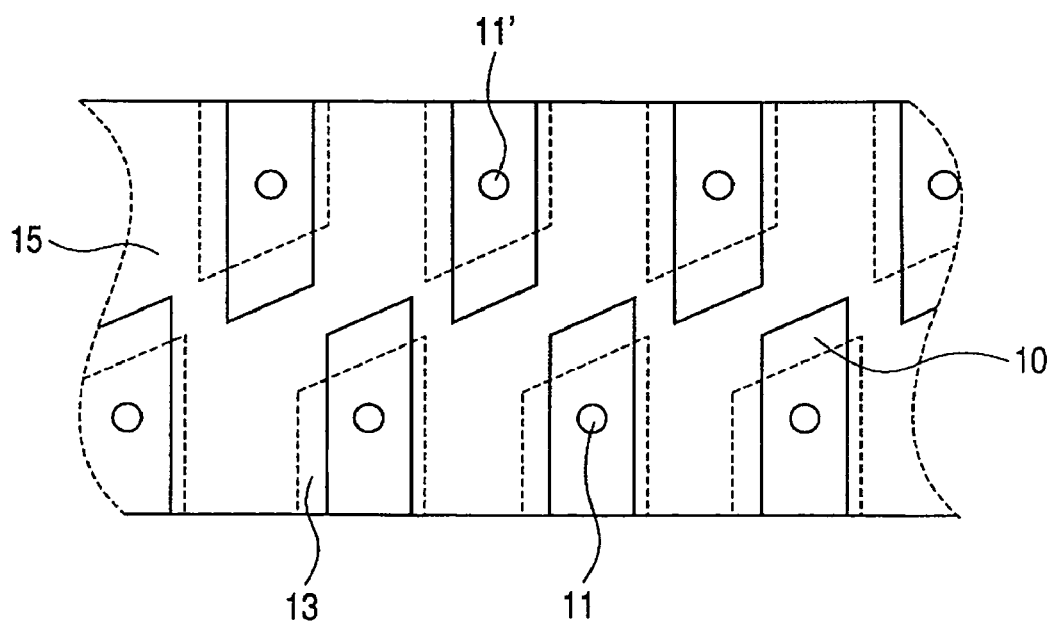
FIG. 9 is a schematic view of the liquid discharge head in FIG. 6 viewed from the upside (discharge port side)

FIGS. 8 and 9 are schematic views of the liquid discharge head shown in FIG. 6 viewed from the upside (discharge port-11 side). The region 13 shown by a broken line shows the separate liquid chamber 13 to which pressure is applied. The piezoelectric element 10 is properly patterned and formed on the separate liquid chamber 13. For example, in FIG. 8, the lower electrode film 16 is drawn out up to a portion where the piezoelectric substance 7 is not present and an upper electrode film 18 (not illustrated) is drawn out up to the opposite side to the lower electrode film 16 and connected to a driving source. In FIGS. 8 and 9, the lower electrode film 16 shows a patterned state. However, as shown in FIG. 7, it is allowed that the lower electrode film 16 is present at a portion where the piezoelectric substance 7 is not present. It is possible to optimally pattern the piezoelectric substance 7, lower electrode film 16 and upper electrode film 18 in accordance with a purpose unless there is a short or disconnection between a driving circuit and the piezoelectric element 10 when driving the piezoelectric element 10. Moreover, the shape of the separate liquid chamber 13 is illustrated as a parallelogram because the chamber 13 has the shape when an individual chamber is formed by using an Si(110) substrate and performing wet etching by alkali. It is allowed that the shape of the separate liquid chamber 13 is otherwise a rectangle or square. In general, a plurality of separate liquid chambers 13 are formed on the vibration plate 15 at a constant pitch. However, as shown in FIG. 9, it is allowed to arrange the individual chambers 13 like staggered arrangement or to use one separate liquid chamber 13 as dictated by a purpose.

The thickness of the vibration plate 15 normally ranges between 0.5 and 10 µm, preferably ranges between 1.0 and 6.0 µm. This thickness includes the thickness of the buffer layer 19 when present. Moreover, it is allowed that a plurality of layers other than the buffer layer are formed. For example, it is allowed that an etching stop layer necessary to form a vibration plate and separate liquid chamber from the same substrate is included. The width Wa of the separate liquid chamber 13 (refer to FIG. 8) normally ranges between 30 and 180 µm. The length Wb of the separate liquid chamber 13 (refer to FIG. 8) normally ranges between 0.3 and 6.0 mm though depending on a discharge liquid quantity. It is preferable that the shape of the discharge port 11 is normally circular or star-shaped and the diameter of the discharge port 11 normally ranges between 7 and 30 µm. It is preferable that the sectional shape of the discharge port 11 is normally a tapered shape enlarged in the direction of the communication hole 12. It is preferable that the length of the communication hole 12 normally ranges between 0.05 and 0.5 mm. When setting the length of the communication hole 12 to 0.5 mm or less, the discharge speed of droplets becomes large enough. Setting the length of the communication hole 12 to 0.05 mm or more is preferable because fluctuation of the discharge speed of droplets becomes small. Moreover, it is allowed that a member or members for forming a vibration plate, separate liquid chamber, common liquid chamber and communication hole constituting a liquid discharge head of the present invention is the same or different. For example, when Si is used, it is possible to accurately work Si by using the lithography method and etching method. Moreover, it is otherwise preferable to use members in which the difference between thermal expansion coefficients ranges between $1 \times 10^{-8}/^{\circ}$ C. and $1 \times 10^{-6}/^{\circ}$ C. For example, it is preferable to select an SUS substrate or Ni substrate for the Si substrate.

Then, a liquid-discharge head fabrication method of the present invention is described. The liquid discharge head fabrication method of the present invention has at least the following steps.

(1) A step of forming a discharge port (2) A step of forming a communication hole for communicating a discharge port and separate liquid chamber (3) A step of forming a separate liquid chamber (4) A step of forming a common liquid chamber communicated to a separate liquid chamber (5) A step of forming a vibration plate for providing vibration for a separate liquid chamber (6) A step of fabricating a piezoelectric element of the present invention for providing vibration for a vibration plate set to the outside of a separate liquid chamber Specifically, as a first method for fabricating a liquid discharge head of the present invention, it is possible to use the method described below. First, a part of a separate liquid chamber and a vibration plate are formed by applying the step of (3) to a substrate on which the piezoelectric element 10 is formed by applying the above-described step of (6). A base member on which a communication hole and common liquid chamber are formed by applying the steps of (2) and (4) and a base member having a discharge port is formed by applying the step of (1). Then, a liquid discharge head is formed by laminating and integrating the above substrate and these base members.

Moreover, as a second method for fabricating a liquid discharge head of the present invention, a method described below can be used. First, a base member on which a separate liquid chamber is formed is fabricated by applying at least the step of (3). Then, separately, a piezoelectric element or a vibration plate and piezoelectric element is or are transferred from a base member on which a piezoelectric element is formed by applying the step of (6) or a base member on which a vibration plate and piezoelectric element are formed by the steps of (5) and (6). Then, a base member portion at the side opposed to the piezoelectric element at least, a base member to which a piezoelectric element or vibration plate and piezoelectric element is or are transferred is worked by applying the step of (2) to form a separate liquid chamber. Moreover, a base member on which a communication hole and common liquid chamber are formed and a base member on which a discharge port is formed are fabricated similarly to the case of the above first method and laminated and integrated to fabricate a liquid discharge head.

Figure 10:
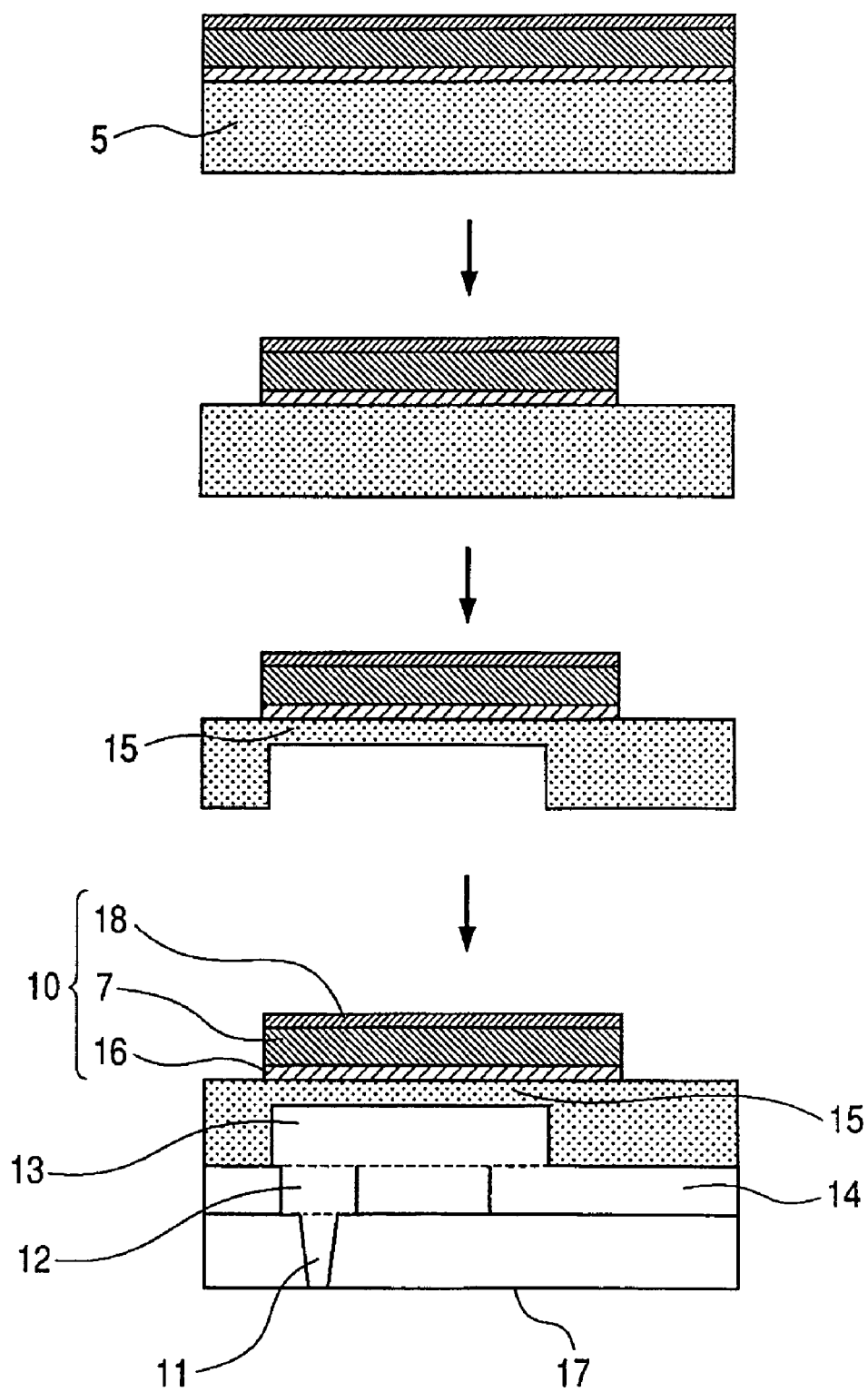
FIG. 10 is a schematic view showing a liquid-discharge-head fabricating step of the present invention.

As a first method, as shown in FIG. 10, the piezoelectric element 10 is formed on the substrate 5 similarly to the case of the piezoelectric-element fabrication method. Then, a part of the substrate 5 is removed while patterning the piezoelectric element 10 to form a part of the separate liquid chamber 13 and the vibration plate 15. Separately, a base member having the common liquid chamber 14 and communication hole 12 is fabricated and a base member on which the discharge port 11 is formed is fabricated. Finally, it is possible to use a fabrication method for laminating and integrating them and forming a liquid discharge head. As a method for removing a part of the substrate 5, it is possible to use the wet etching method, dry etching method or sand mill method. By removing a part of the substrate 5 by this method, it is possible to form the vibration plate 15 and at least a part of the separate liquid chamber 13.

Figure 11:
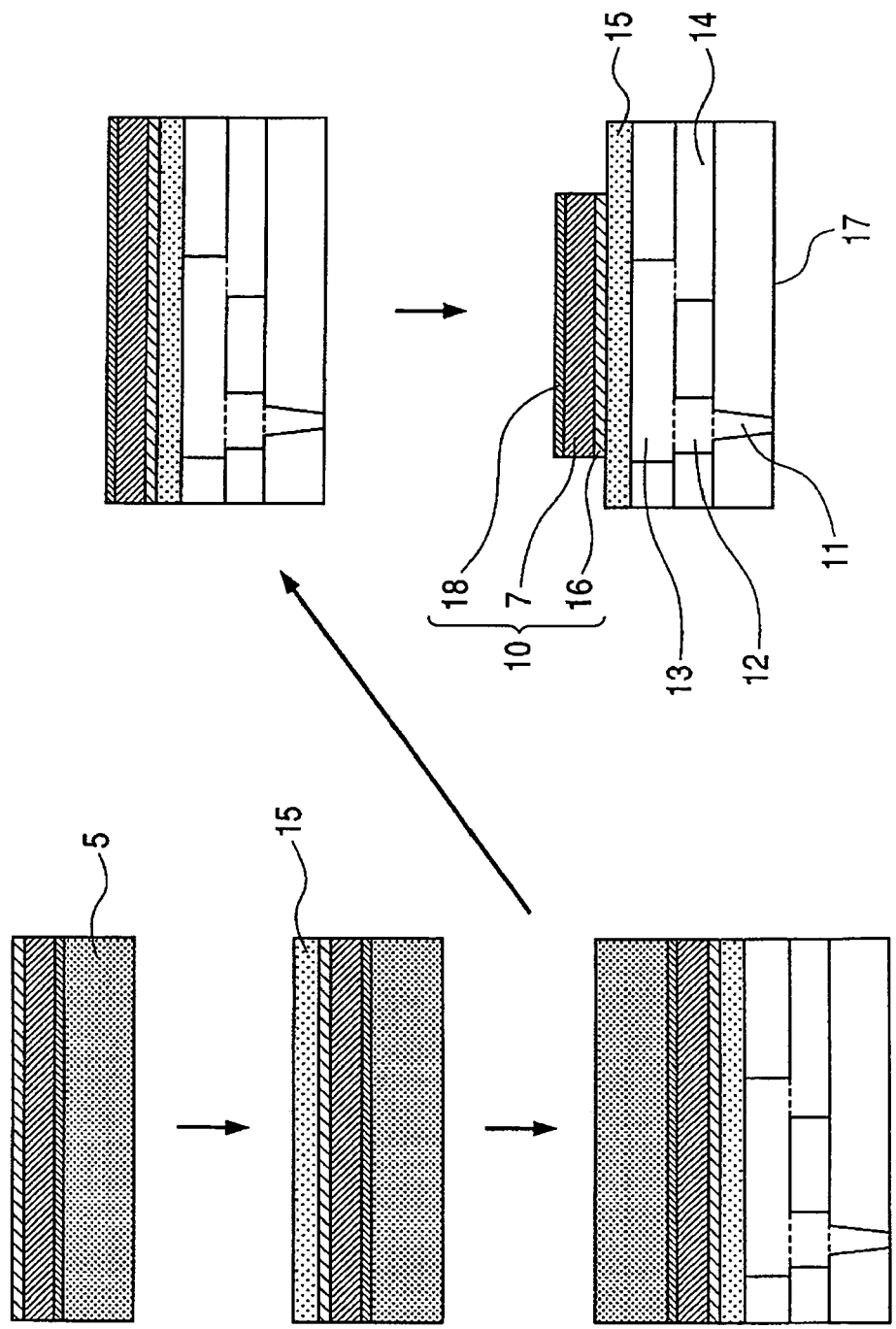
FIG. 11 is a schematic view showing a liquid-discharge-head fabricating step of the present invention.

As a second method, as shown in FIG. 11, the piezoelectric element 10 is first set on the substrate 5 similarly to the case of the piezoelectric-element fabrication method. Then, a base member on which the vibration plate 15 is formed on the piezoelectric element 10 while the piezoelectric element 10 is not patterned. Moreover, it is possible to use a fabrication method for fabricating and laminating a base member provided with the separate liquid chamber 13, base member provided with the communication hole 12 and common liquid chamber 14 and base member provided with the discharge port 11 and then transferring a vibration plate and piezoelectric element from the above substrate.

Figure 12:
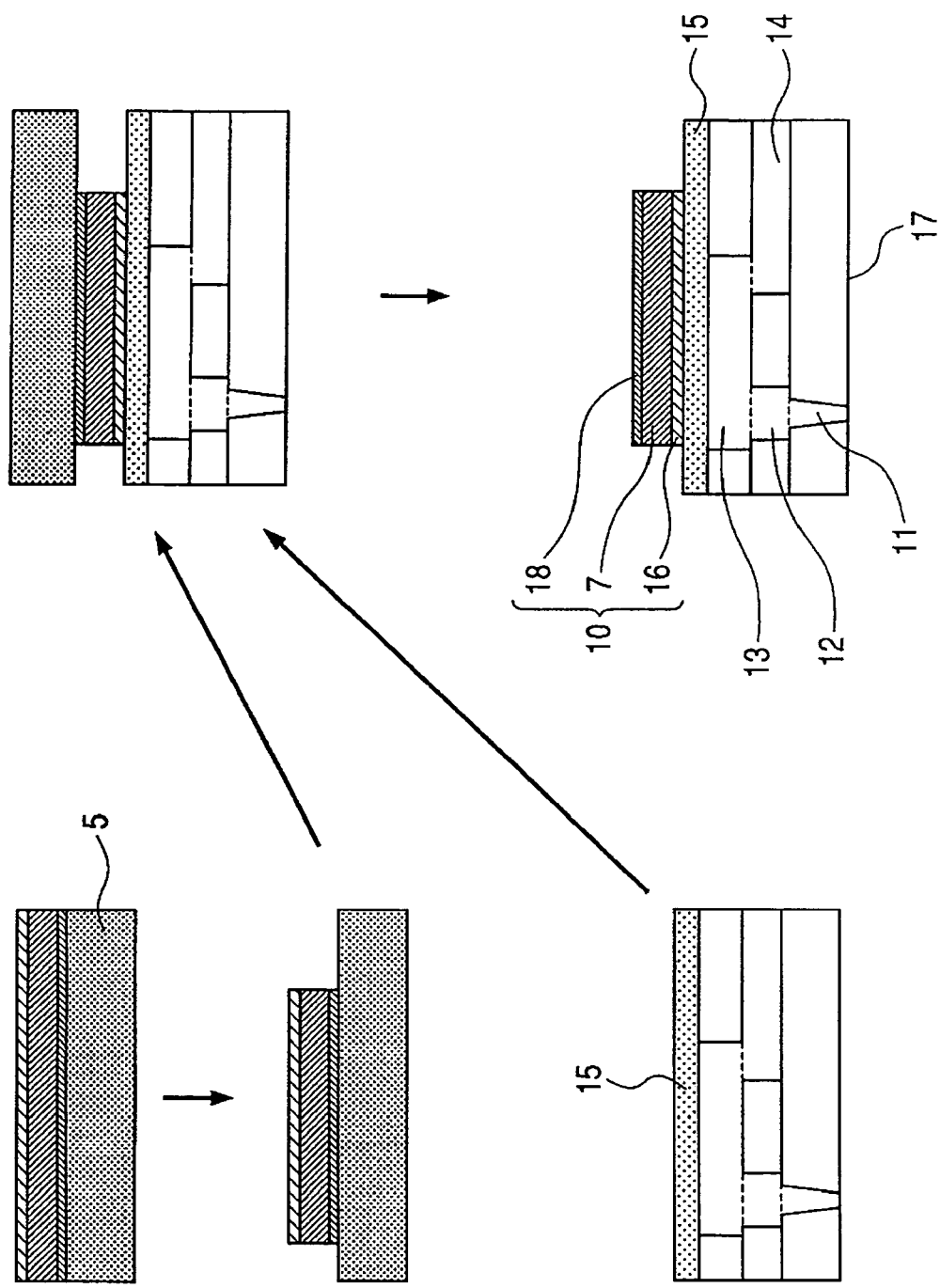
FIG. 12 is a schematic view showing a liquid-discharge-head fabricating step of the preset invention.
Figure 13A:
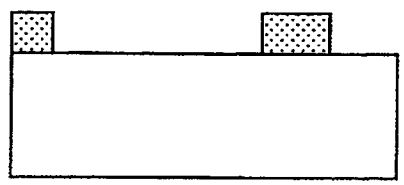
FIGS. 13A, 13B, 13C, 13D, 13E and 13F are schematic views showing a liquid-discharge-head fabricating step of the preset invention.
Figure 13E:
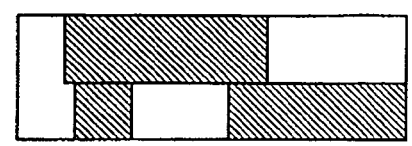
Figure 13B:
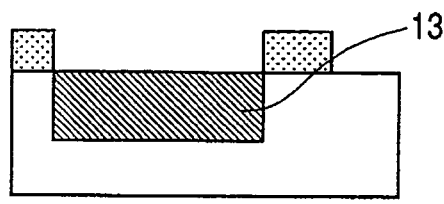
Figure 13F:
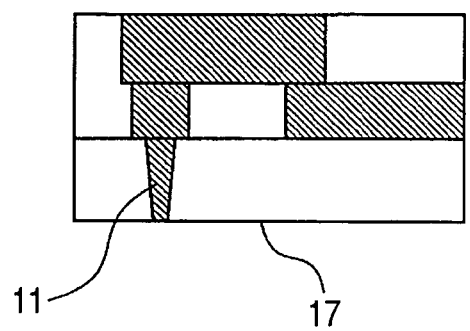
Figure 13C:
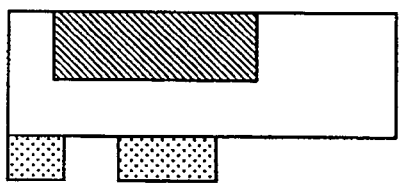
Figure 13D:
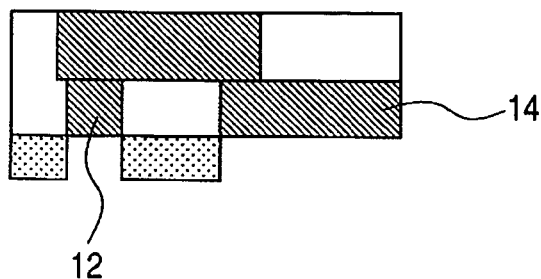

Moreover, as shown in FIG. 12, the piezoelectric element 10 is formed on the substrate 5 and patterned to form a piezoelectric element. By separately setting the vibration plate 15 on a base member, a base member provided with a part of the separate liquid chamber 13, base member provided with the common liquid chamber 14 and communication hole 12 and base member on which the discharge port 11 is formed are fabricated. Moreover, it is possible to use a fabrication method for laminating the base members, transferring the piezoelectric element 10 from the base members and forming a liquid discharge head.

As a joining method at the time of transfer, it is preferable to use a method for using an inorganic adhesive or organic adhesive. However, it is more preferable to use metallic junction with inorganic material. As materials used for metallic junction, it is possible to use In, Au, Cu, Ni, Pb, Ti, Cr and Pd. When using these materials, junction can be made at a low temperature of 300° C. or lower and the difference between thermal expansion coefficients from a substrate decreases. Therefore, when a material is lengthened, a problem due to warp of a piezoelectric element is avoided and a piezoelectric element is not greatly damaged.

The communication hole 12 and common liquid chamber 14 in the first method and the separate liquid chamber 13, communication hole 12 and common liquid chamber 14 in the second method can be formed by performing a step of patterning a forming member (base member) through lithography and a step of removing a part of the member through etching. For example, in the case of the second method, the separate liquid chamber 13, communication hole 12 and common liquid chamber 14 are formed by steps of a) to e) shown in FIG. 13. Symbol a) shows a step of forming a mask for the separate liquid chamber 13 and symbol b) shows a step in which the separate liquid chamber 13 is worked from the upside through etching (hatched portion denotes a working portion). Moreover, symbol c) shows a step of removing the mask used for the separate liquid chamber 13 and forming the communication hole 12 and common liquid chamber 14 and symbol d) shows a step of working from downside through etching. Furthermore, symbol e) schematically shows a state in which the mask used to form the communication hole 12 and common liquid chamber 14 is removed and the separate liquid chamber 13, communication hole 12 and common liquid chamber 14 are formed. The discharge port 11 is formed by applying etching working, mechanical working and laser working to the base member 17. Symbol f) shows a state in which the base member 17 on which the discharge port 11 is formed is joined with a base member on which the separate liquid chamber 13, communication hole 12 and common liquid chamber 14 are formed after symbol e). It is preferable that the surface of the base member 17 provided with a discharge port is water-repellent-treated. The joining method of each base member is the same as the joining method at the time of transfer. However, it is allowed to use positive-electrode oxidation junction.

In the case of the second method, it is preferable to use another base member for transferring the piezoelectric element 10 on the substrate 5 in the state e) or f) in FIG. 13. In this case, when a vibration plate is formed on the piezoelectric element on the substrate 5, the piezoelectric element 10 is directly transferred onto the separate liquid chamber 13 in the state e) or f) in FIG. 13. Moreover, when the vibration plate is not formed on the piezoelectric element on the substrate 5, the hole of the separate liquid chamber 13 in the state e) or f) in FIG. 13 is filled with resin to form a vibration plate and then, the resin is removed through etching and the vibration plate is formed and transferred. In this case, it is preferable to form the vibration plate by using a film forming method such as the sputtering method or CVD method. Moreover, it is allowed that the pattern forming step of the piezoelectric element 10 is set before or after transfer.

[Liquid Discharge Apparatus]

Then, a liquid discharge apparatus of the present invention is described below. The liquid discharge apparatus of the present invention has the above liquid discharge head of the present invention.

Figure 14:
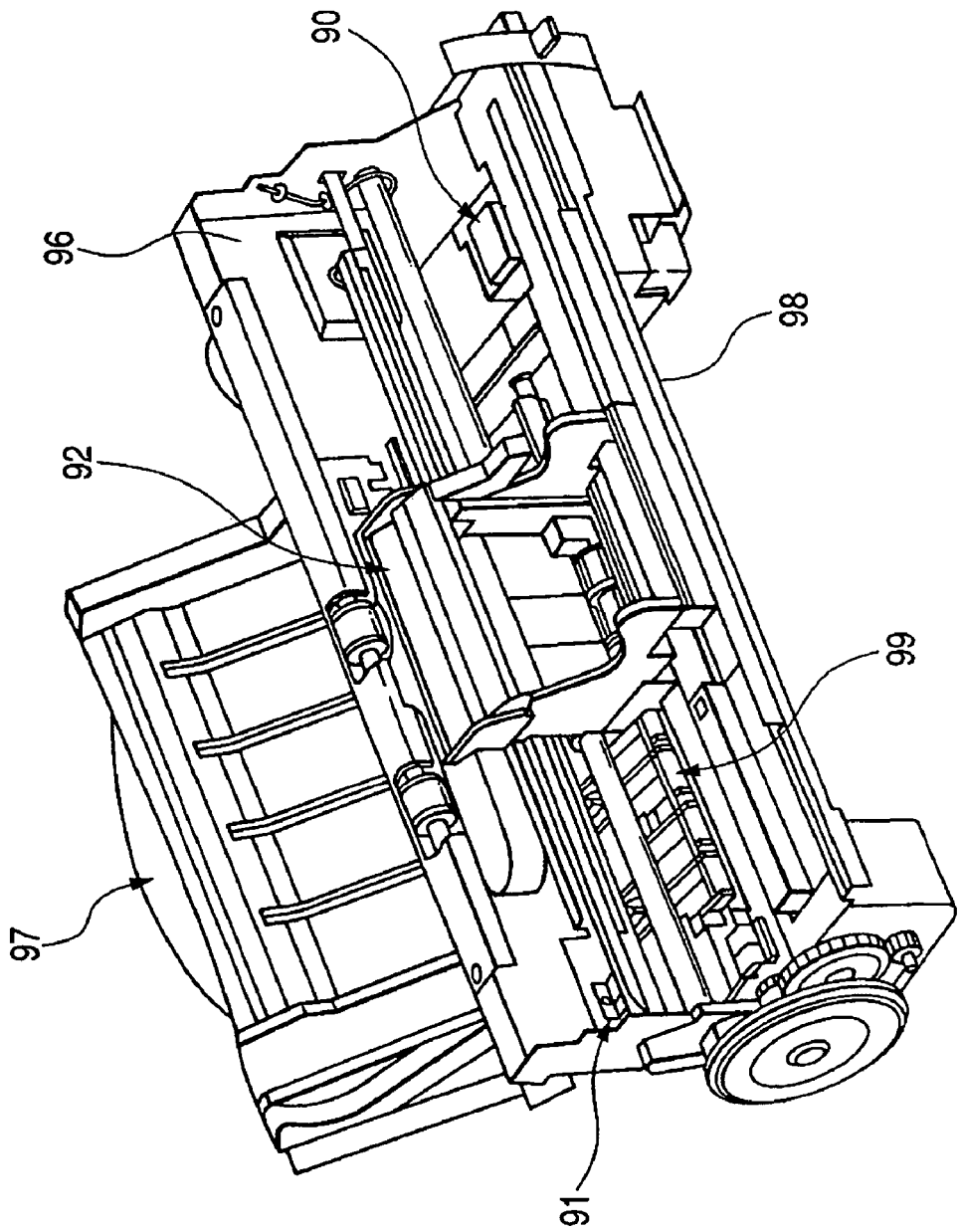
FIG. 14 is a perspective view showing an embodiment of a liquid-discharge apparatus of the present invention.

It is possible to use the ink jet recording apparatus shown in FIG. 15 as a liquid discharge apparatus of the present invention. FIG. 14 shows a state in which the amour of a liquid discharge apparatus (ink jet recording apparatus) is removed. An ink jet recording apparatus 81 has an automatic feeding portion 97 for automatically feeding a recording sheet serving as a recording medium into an apparatus body 96. Moreover, the liquid discharge apparatus has a carrying portion 99 for leading the recording sheet sent from the automatic feeding portion 97 to a predetermined recording position and leading the recording sheet from the recording position to a discharge port 98, recording portion 91 for recording data in the recording sheet carried to the recording position and recovering portion 90. The recording portion 91 houses a liquid discharge head of the present invention and is provided with a carriage 92 to be reciprocated on a rail.

In the case of the ink jet recording apparatus, the carriage 92 is transferred onto the rail in accordance with an electrical signal sent from a computer, a driving voltage is applied to electrodes for holding a piezoelectric element and the piezoelectric element is displaced. Each piezoelectric chamber is pressurized through the vibration plate 15 due to the displacement of the piezoelectric element to discharge ink from the discharge port 11 and perform printing.

In the case of a liquid discharge apparatus of the present invention, it is possible to uniformly discharge liquid at a high speed and downsize the apparatus.

The above example is shown as a printer. However, it is possible to use a liquid discharge apparatus of the present invention as a facsimile or ink jet recording apparatus such as a composite machine or copying machine or as an industrial liquid discharge apparatus.

Then, the present invention is described in accordance with embodiments.

EXAMPLE 1

A PZN—PT thin film which is a perovskite type oxide thin film is formed by using the MO-CVD method.

[Material]

Pb(thd)$_2$ is used as a Pb material, Zn(EDMDD)$_2$ is used as a Zn material, (C$_2$H$_5$)$_5$Nb is used as a Nb material and Ti(i-C$_3$H$_7$O)$_4$ is used as a Ti material.

[Fabrication Method]

A substrate in which a SRO(100) electrode is formed on a STO(100) substrate is used. The introduction quantity of a source gas is adjusted while adjusting the temperature of the substrate to 600° C. and partial pressures of oxygen gas and nitrogen gas to 330 Pa.

Because A-site element is Pb and B-site elements are Zn, Nb and Ti, they are grouped into group I(Pb and Ti) and group II(Zn and Nb) and each material containing elements included in the groups is supplied onto the substrate in separate steps.

First, a first step for supplying Pb and Ti for 10 sec is performed. Then, supply of the materials is stopped for 5 sec to calcinate a thin film formed on the substrate at 600° C. which is the temperature of the substrate. Then, a second step of supplying Zn and Nb for 10 sec is performed while adjusting partial pressures of oxygen gas and nitrogen gas to 330 Pa and supplying the gases and material supply is stopped for 5 sec to calcinate a thin film formed on the substrate at 600° C. which is the temperature of the substrate. The above steps are repeated for 3 hr to obtain a PZN—PT thin film which is 2.0 µm thick (composition: 0.91Pb(Zn$_{1/3}$Nb$_{2/3}$)O$_3$-0.09PbTiO$_3$). It is found that the above thin film is a high-quality perovskite type oxide thin film free from pyrochlore phase according to the X-ray diffraction analysis (sometimes referred to as XRD analysis of the obtained thin film). Moreover, the thin film is a single crystal thin film having crystallinity of (100). As a result of preparing a unimorph cantilever and calculating e31 value through displacement value evaluation, a large value equal to or less −12 is obtained. A high-quality film can be formed by the above method because it is considered that a mechanism is used in which Zn and Nb of group II first respectively form oxide and elements respectively become a not-diffused state and then the elements respectively become perovskite oxide due to diffusion of Pb and thereby, the film becomes a composition-controlled and crystal-controlled film.

COMPARATIVE EXAMPLE 1

An example is shown in which Pb, Nb, Zn and Ti are simultaneously supplied without dividing materials. Pb, Nb, Zn and Ti are supplied in the first step and Pb, Nb, Zn and Ti are also supplied in the second step. A PZN—PT thin film (composition: 0.91 Pb(Zn$_{1/3}$Nb$_{2/3}$)O$_3$-0.09PbTiO$_3$) is obtained similarly to the case of the example 1 other than the above mentioned. The thickness of the obtained thin film ranges between 1.9 and 2.0 nm. As a result of analyzing XRD and evaluating a piezoelectric characteristic similarly to the case of the example 1, the above thin film is a perovskite type oxide thin film including a pyrochlore phase and a piezoelectric characteristic is not preferable and the absolute value of e31 is less than 2.

EXAMPLE 2

A PZN—PT thin film (thickness of 0.89PZN-0.11PT is 1.5 μm) is obtained similarly to the case of the example 1 except that a substrate in which $SRO(100)/LaNiO_3(100)/CeO_2(100)/YSZ(100)$ is laminated on Si(100) substrate is used. As a result of analyzing XRD and evaluating a piezoelectric characteristic similarly to the case of the example 1, the above thin film has a perovskite structure and a single crystal film having crystallinity of (100) is obtained. As a result of forming an upper electrode of 100 μmφ and measuring d33, a preferable piezoelectric characteristic of 350 pm/V is shown.

EXAMPLE 3

A PZN—PT film is formed by the method same as the case of the example 1 on an SOI substrate in which SOI layer has a thickness of 3 μm and a box layer has a thickness of 0.5 μm through an SRO(100) electrode. Because in the case of this substrate, a box layer functions as an etching stop layer, it is advantageous for working in subsequent steps and it is possible to obtain an element having preferable adhesiveness when using an SOI layer as a vibration plate.

By etching the handle layer of an SOI substrate, a separate liquid chamber and liquid supply port are obtained. By joining the separate liquid chamber and liquid supply port with a substrate having a discharge port, the liquid discharge head shown in FIG. 6 is prepared. The separate liquid chamber is worked into a length of 100 μm and length of 3 mm. A voltage of 30 V is applied to a PZN—PT layer which is a piezoelectric element at 25 kHz to measure the displacement of an SOI layer serving as a vibration plate. It is possible to measure a displacement of 0.15 μm or more having a preferable trackability for an electric field in displacement observation and confirm that this head has a superior characteristic as a liquid discharge head.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application No. 2005-305815 filed on Oct. 20, 2005, which is hereby incorporated by reference herein.

What is claimed is:

1. A film forming method for forming a perovskite type oxide thin film having a plurality of elements constituting at least one of A site and B site on a substrate, wherein the perovskite oxide is expressed by the following chemical formula (1), that is, $(A1_x, A2_y, A3_z)(B1_j, B2_k, B3_l, B4_m, B5_n)O_3$ . . . (1) (where, element A1 shows Pb and elements A2 and A3 are different from each other and respectively show any one of Bi, Ba, Sr, Ca, and La; elements B1, B2, B3, B4, and B5 are different from each other and show any one of Nb, Yb, Mg, Zn, Sc, Ta, Ti, Zr, In and Ni; x, y and z are real numbers between 0 and 1 (inclusive) satisfying the relation expressed by $x+y+z \geq 1.0$; and j, k, l, m and n are real numbers between 0 and 1 (inclusive) satisfying the relation expressed by $j+k+l+m+n=1$), a plurality of steps of supplying materials containing the elements onto the substrate are included, and the A1, A2, A3, B1, B2, B3, B4, and B5 are divided into a plurality of groups and each material containing elements included in each of the groups is supplied onto the substrate in a separate step.

2. The film forming method according to claim 1, wherein the above steps are repeatedly performed.

3. The film forming method according to claim 1, wherein after the step of supplying materials onto the substrate, the substrate is heated.

4. The film forming method according to claim 1, wherein a perovskite type oxide thin film is a relaxor perovskite type oxide thin film.

5. The film forming method according to claim 1, wherein the film forming method is a film forming method using any one of the organic-metal chemical vapor-phase deposition method, sol-gel method, and metallic organic-compound deposition method.

6. The film forming method according to claim 1, wherein at least one element included in the A site and at least one element included in the B site belong to at least one of the plurality of groups.

* * * * *